United States Patent
Tamhaukar et al.

[11] Patent Number: 5,242,535
[45] Date of Patent: Sep. 7, 1993

[54] METHOD OF FORMING A COPPER CIRCUIT PATTERN

[75] Inventors: Satish S. Tamhaukar, Scotch Plains; Edward Chang, New Providence, both of N.J.; Richard Paciej, Lansdale, Pa.; Mark J. Kirschner, Morristown, N.J.

[73] Assignee: The BOC Group, Inc., New Providence, N.J.

[21] Appl. No.: 953,442

[22] Filed: Sep. 29, 1992

[51] Int. Cl.$^5$ .................... B44C 1/22; C23F 1/00
[52] U.S. Cl. .................... 156/634; 156/656; 156/659.1; 156/666; 156/901; 205/103; 205/125
[58] Field of Search ........... 156/629, 634, 656, 659.1, 156/666, 667, 901, 902, 150, 151; 204/15; 430/313, 314, 315, 318

[56] References Cited

U.S. PATENT DOCUMENTS

| | | | |
|---|---|---|---|
| 3,634,202 | 1/1971 | Michelet et al. | 214/15 |
| 3,883,947 | 5/1975 | Kruger et al. | 29/578 |
| 4,606,788 | 8/1986 | Moran | 156/656 |
| 4,657,778 | 4/1987 | Moran | 427/53.1 |
| 4,853,277 | 8/1989 | Chant | 156/150 X |
| 4,987,677 | 1/1991 | Tanaka et al. | 29/846 |
| 5,036,167 | 7/1991 | Kasai | 174/256 |

FOREIGN PATENT DOCUMENTS 2-71581 12/1990 Japan.

*Primary Examiner*—William A. Powell
*Attorney, Agent, or Firm*—David M. Rosenblum; Larry R. Cassett

[57] ABSTRACT

A method of forming a copper circuit pattern on a ceramic substrate. In accordance with the method, first and second layers of copper oxide and copper are applied to the ceramic substrate. Selected regions of the copper are then masked so that unmasked regions are formed on the copper in a configuration of the copper circuit pattern. Masked regions are formed on the copper adjacent the unmasked regions, where copper cannot be plated. The unmasked regions of the copper are plated in a neutral pH solution by a reverse pulse plating process. The masking is then removed and the copper and copper oxide layers are etched so that the copper and copper oxide is removed from the unmasked regions. Thereafter, the remaining copper is direct bonded to the substrate.

12 Claims, 1 Drawing Sheet

METHOD OF FORMING A COPPER CIRCUIT PATTERN

BACKGROUND OF THE INVENTION

The present invention relates to a method of forming a copper circuit pattern on a ceramic substrate. More particularly, the present invention relates to such a method in which the copper is bonded to the ceramic substrate by a direct bond process.

It is known in the prior art to bond copper directly to a ceramic substrate (such as aluminum oxide) and then to etch the copper to form a copper circuit pattern on the ceramic substrate. The copper is directly bonded to the substrate by forming a copper/copper oxide melt between the copper and the substrate. Upon the cooling of the melt, a strong bond is formed between the copper and the substrate. This process is fully described in U.S. Pat. No. 3,766,634.

After the copper is directly bonded to the substrate, the copper circuit pattern is formed by conventional techniques such as are known in the art for fabricating a printed circuit. A printed circuit is produced by a etching process in which the copper is etched in a pattern corresponding to the desired electrical pathways of the circuit. In forming the printed circuit, a mask of resist is applied to the copper by silk screen printing. The copper and substrate are then submerged in a bath of etching solution, generally an aqueous solution of hydrochloric acid. After the elapse of a suitable time interval, copper is removed by the hydrochloric acid in the unmasked areas down to the substrate to produce a copper circuit pattern that is identical to the pattern of the applied mask.

The thicker the copper circuit pattern, the more electrical load carrying capability of the finished circuit. The manufacture of thick copper circuit patterns in which the copper is directly bonded to the substrate has, however, proven to be uneconomical because of unacceptably long etching times involved in etching thick layers of copper. Additionally, well known and undesirable shadow effect is produced as a result of the prolonged exposure to acid. As will be discussed, the present invention provides a method of forming a copper circuit pattern on a ceramic substrate that incorporates the virtues of the strong bond that is effected between copper and a ceramic substrate by a direct bond process while making it economical to form copper conductor patterns of increased thickness in such directly bonded copper without the occurance of shadow effect.

SUMMARY OF THE INVENTION

In accordance with the method of the present invention, a method is provided for forming a copper circuit pattern on a ceramic substrate. In the method a composite is formed comprising the ceramic substrate, a first layer of copper oxide located over the substrate, and a second layer of copper located over the copper oxide. Thereafter, selected regions of the copper are masked so that unmasked regions are formed on the copper in a configuration of the copper circuit pattern and the masked regions are formed on the copper adjacent the unmasked regions, where copper cannot be plated. The unmasked regions of the copper are then plated with copper to increase the thickness of the unmasked regions The plating is effected in a neutral pH solution by a reverse pulse plating process. The neutral pH solution is necessary so as not to remove the first layer of the copper oxide. Additionally, unlike conventional photo etching processes of the prior art, it is the unmasked regions that will have the configuration of the copper circuit pattern. The mask is then removed and first and second layers of copper oxide and copper are etched so that the copper and copper oxide are removed from the unmasked regions. Either before or after the etching, the copper is bonded to the substrate by a direct bond process.

During the etching, the unplated first and second copper oxide and copper layers in the unplated regions will be removed before appreciable thickness reduction appears in thicker plated regions. If the exact thickness of the copper circuit pattern is extremely critical, the thickness of the plating can be selected so that the plated regions will be of the desired thickness after etching. Since, the first and second layers of copper oxide and copper are thin to begin with, these layers in the unplated regions can be removed in a relatively short time interval as compared with the time intervals that would be involved in etching a thick layer of copper and as were required in the prior art. It is this reduction in the etching time that makes it cost effective to form thick copper circuit patterns in which the copper is directly bonded to the substrate. Furthermore, the reduced etching time eliminates any noticable shadow effect.

BRIEF DESCRIPTION OF THE DRAWINGS

Although the specification concludes with claims distinctly pointing out the subject matter that Applicants regard as their invention, it is believed that the invention will be understood when taken into connection with the accompanying drawings in which

DETAILED DESCRIPTION

Figure 1:
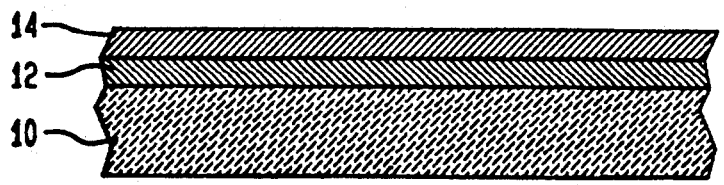
FIGS. 1-5 are fragmentary, sectional, schematic views of successive stages of manufacture of a copper circuit pattern on a ceramic substrate in accordance with a method of the present invention.

With reference to the FIG. 1, a ceramic substrate 10 is provided which can be formed of aluminum oxide or beryllium oxide. Ceramic substrate 10 is first cleaned in a conventional manner with solvents in an ultrasonic cleaner. In this regard, suitable solvents are acetone, alcohol, and chlorinated solvents. A copper oxide/copper composite is then formed by sputtering a first layer of copper oxide 12 onto substrate 10, to a thickness in a range of between from about 500 and about 5000 angstroms. Preferably, the thickness of first layer of copper oxide is in a range of between 1000 and about 2000 angstroms and most preferably about 2000 angstroms. First layer of copper oxide 12 is applied by sputtering copper in a standard DC MAGNATRON or other sputtering equipment in a reactive atmosphere containing approximately 100% oxygen. Thereafter, the oxygen is cut-off and the sputtering is continued in an essentially inert atmosphere to apply a second layer of copper 14 onto first layer of copper oxide 12. Second layer of copper 14 must be thick enough so that there are no discontinuities in the layer and further, so that the layer exhibits sufficient conductance for its service as a cathode in the plating process contemplated in the present invention. Preferably, the sputtering is continued until second layer of copper 14 has a total thickness of approximately 1.00 micrometers.

Figure 2:
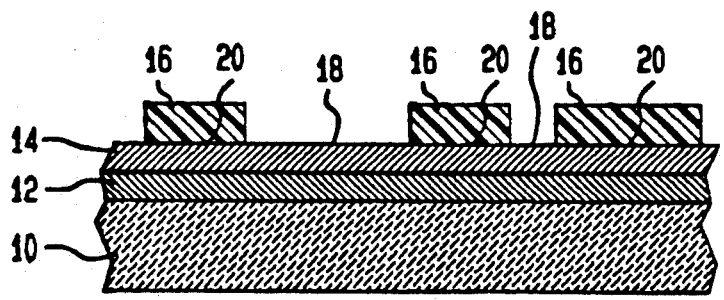

With reference to FIG. 2, a mask 16 is applied to second layer of copper 14 so that unmasked regions 18 of copper 14 are formed on first layer of copper 14 in a configuration of the desired copper circuit pattern. Masked regions 20 are thus formed on second layer of copper 14 adjacent unmasked regions 18, where copper cannot be plated. Mask 16 comprises conventional photoresist materials and is conventionally applied by silk-screen printing or any other well known technique.

Figure 3:
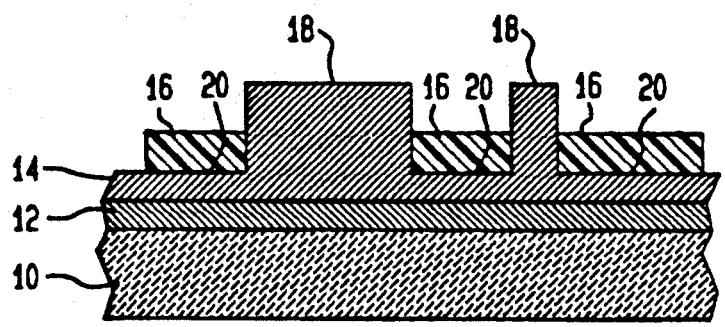

With reference to FIG. 3, copper is then plated onto unmasked regions 18 to increase the thickness of the desired circuit pattern so that it can conduct a higher current. This is accomplished by a reverse pulse copper plating process. In such process, substrate 10 with first and second layers of copper oxide and copper 12 and 14 and mask 16 are suspended within a plating cell containing an aqueous, room temperature, saturated solution of copper sulfate (a near neutral pH solution) which acts as an electrolyte. Second layer of copper 14 acts as the cathode and a copper plate or foil acts as the anode. Nitrogen should preferably be continuously bubbled through the copper sulfate to keep it free of dissolved oxygen. The saturated solution of copper sulfate prevents dissolution of first layer of copper oxide 12 which would otherwise readily dissolve in a acidic medium normally used in plating.

Plating is then achieved by either using a reversing current or voltage. As an example, first, $-0.7$ volts (versus a saturated calomel reference electrode) is applied for about one second. Copper ions, hydrogen ions, and oxygen will be reduced to form copper metal, nascent hydrogen and hydroxyl ions. The voltage is then reversed to approximately $+0.05$ volts for approximately 0.1 seconds. At $+0.05$ volts, copper is cathodically protected and will not be oxidized. However, any nascent hydrogen produced during the plating cycle on the copper surface or slightly below the surface will undergo oxidation to form hydrogen ions. As a result, hydrogen diffusion into the copper plate or up-take of the copper plate will be minimized. Also, the rate of copper plating will be greater than at a constant plating voltage, since by and large plating occurs at $-0.7$ volts. In order to complete the process the voltage is cycled back and forth between $-0.7$ volts for about 1 second and $+0.05$ volts for about 0.1 seconds until the copper has been built up to the desired thickness. This can be done with conventional equipment that is readily available.

The $-0.7$ volts experimentally produced a plating current of 200 microamperes and the $+0.05$ reversed voltage produced a plating current of approximately 1 to 10 microamperes. It was found that in approximately 24 hours, after the consumption of approximately 8.99 E3 coulombs, unmasked regions 18 reached a plate thickness of approximately 0.13 mm to about 0.15 mm in an area of about 5 cm$^3$.

After the electroplating, the masking material is stripped or washed away with a solvent, for instance acetone, and previously unexposed regions 20 are etched in an aqueous 5% by volume hydrochloric acid solution in a matter of seconds. This removes copper and copper oxide from previously unexposed regions 20. Exposed regions 18 have copper also removed, but with a relatively small percentage of thickness.

Figure 4:
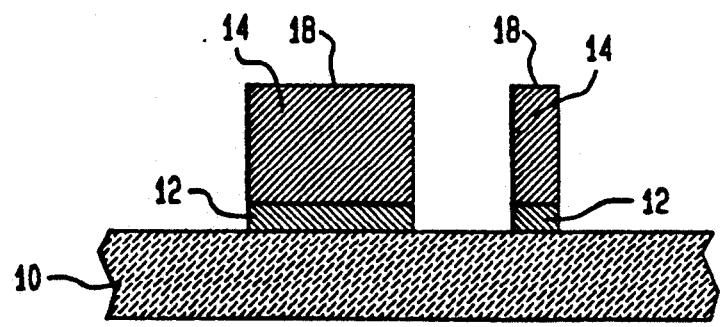
Figure 5:
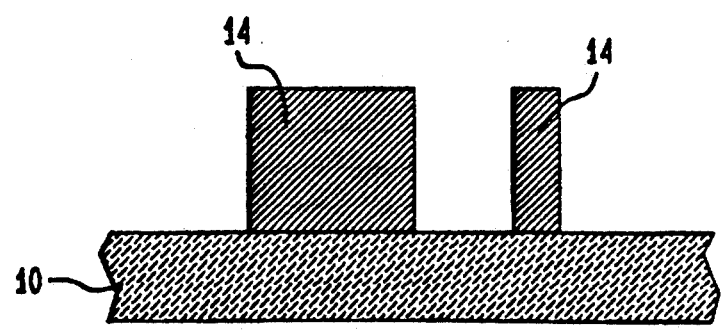

With reference to FIG. 5, the substrate illustrated in FIG. 4 was fired in a nitrogen belt furnace having a peak temperature in a range of between 1065 degrees C. and about 1080 degrees C., preferably 1075 degrees C. This temperature is below the melting point of copper but is above the eutectic temperature of the copper/copper oxide mixture. After cooling, the remains of second layer of copper 14 are bonded to ceramic 10 with an exceedingly strong bond.

As can be appreciated, the direct bonding could take place before the etching step, described above, without any change in the final product.

While the invention has been described with reference to a preferred embodiment, it will be readily understood by those skilled in the art that numerous changes and omissions can be made without departing from the spirit and scope of the present invention.

We claim:

1. A method of forming a copper circuit pattern on a ceramic substrate, said method comprising:

forming a composite comprising the substrate, a first layer of copper oxide located over the substrate, and a second layer of copper located over the copper oxide;

masking selected regions of the second layer of copper so that unmasked regions are formed on the copper in a configuration of the copper circuit pattern and masked regions are formed on the copper, adjacent the unmasked regions, where copper cannot be plated;

plating the unmasked regions of the copper with copper to increase the thickness of the unmasked regions;

the plating being effected in a neutral pH solution by a reverse pulse plating process;

removing the masking;

etching the first and second copper oxide and copper layers so that the copper oxide is removed from the unmasked regions; and bonding the copper to the substrate by a direct bond process.

2. The method of claim 1, wherein:

the first layer of the copper oxide is formed by sputtering copper onto the substrate in an essentially pure oxygen atmosphere; and the second layer of copper is formed by sputtering the copper onto the first layer of the copper oxide in an atmosphere that will not substantially react with the copper.

3. The method of claim 1, wherein:

the selected regions of the copper layer are masked by applying photo resist in the masked regions of the copper layer; and the mask is removed by stripping the photoresist from the copper layer.

4. The method of claim 1, wherein the copper and copper oxide layers are removed in the masked regions by etching the substrate, copper, copper oxide in an acidic bath.

5. The method of claim 4, wherein the acidic bath comprises an aqueous solution containing about 5% by volume of HCl.

6. The method of claim 1, wherein the first copper oxide layer has a thickness in a range of between about 500 and about 5000 angstroms.

7. The method of claim 1, wherein the first copper oxide layer has a thickness in a range of between about 1000 and about 2000 angstroms.

8. The method of claim 1, wherein the first layer of the copper oxide is about 2000 angstroms thick.

9. The method of claim 1, wherein the second layer of copper has a thickness of about 1.0 micrometers.

10. The method of claim 1, wherein:
the first layer of copper oxide has a thickness of about 2000 angstroms; and
the second layer of copper has a thickness of about 1 micrometer.

11. The method of claim 1, wherein during the direct bond process the copper, copper oxide, and substrate are subjected to a temperature in a range of between about 1065° C. and about 1080° C. in an essentially chemically non-reactive atmosphere so that a eutectic melt is formed and the eutectic melt is then cooled to effect the direct bond between the copper and the substrate.

12. The method of claim 1, wherein during the direct bond process the copper, copper oxide, and substrate are subjected to a temperature of about 1075° C. in an essentially chemically non-reactive atmosphere so that a eutectic melt is formed and the eutectic melt is then cooled to effect the direct bond between the copper and the substrate.

* * * * *